United States Patent [19]

Mochizuki et al.

[11] Patent Number: 5,578,696

[45] Date of Patent: Nov. 26, 1996

[54] HEAT RESISTANT ADHESIVE FILM, AN ADHESION STRUCTURE, AND METHOD OF ADHESION

[75] Inventors: Amane Mochizuki; Kazumi Higashi; Masako Maeda, all of Osaka, Japan

[73] Assignee: Nitto Denko Corporation, Osaka, Japan

[21] Appl. No.: 223,661

[22] Filed: Apr. 6, 1994

[30] Foreign Application Priority Data

Apr. 7, 1993 [JP] Japan .................................. 5-080592
Dec. 24, 1993 [JP] Japan .................................. 5-327493

[51] Int. Cl.$^6$ .......................... C08G 73/10; C08G 69/26
[52] U.S. Cl. .......................... 528/353; 528/125; 528/128; 528/170; 528/172; 528/173; 528/174; 528/176; 528/183; 528/188; 528/220; 528/229; 528/350; 428/458; 428/473.5
[58] Field of Search .................................. 528/353, 350, 528/220, 229, 125, 128, 170, 172, 173, 174, 176, 183, 188; 428/473.5, 458

[56] References Cited

U.S. PATENT DOCUMENTS

| | | | |
|---|---|---|---|
| 4,496,711 | 1/1985 | Landis | 528/351 |
| 4,613,637 | 9/1986 | Landis et al. | 528/351 |
| 4,699,841 | 10/1987 | Kundinger et al. | 528/351 |
| 4,705,720 | 11/1987 | Kundinger et al. | 528/351 |
| 5,306,741 | 4/1994 | Chen et al. | 528/351 |

*Primary Examiner*—James J. Seidleck
*Assistant Examiner*—P. Hampton-Hightower
*Attorney, Agent, or Firm*—Sughrue, Mion, Zinn, Macpeak & Seas

[57] ABSTRACT

A heat-resistant adhesive film, an adhesion structure obtained using the same, and an adhesion method using the same are disclosed, the film comprising a polyisoimide resin containing at least 40 mol % of an isoimide unit represented by formula (I):

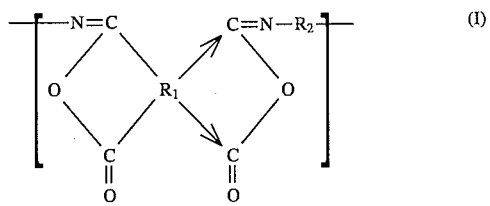

wherein $R_1$ represents a tetravalent aromatic or aliphatic residue; $R_2$ represents a divalent aromatic or aliphatic residue; and the arrow represents a bond replaceable on isomerization, in the molecule thereof. The isoimide unit of the polyisoimide resin is easily converted to an imide unit on heating, e.g., hot pressing with an adherend, to provide a cover-lay film or a single-sided or double-sided base for printed circuit boards having excellent adhesion, heat resistance, dimensional precision, and workability.

5 Claims, No Drawings

HEAT RESISTANT ADHESIVE FILM, AN ADHESION STRUCTURE, AND METHOD OF ADHESION

FIELD OF THE INVENTION

The present invention relates to a heat-resistant adhesive film comprising a resin layer containing an isoimide unit as a polyimide precursor in the molecule thereof; an adhesion structure comprising the adhesive film; and a method of adhesion using the adhesive film.

BACKGROUND OF THE INVENTION

With the recent development of the electronic and electric industries, simplification, size reduction and high reliability have been demanded in mounting circuit elements in appliances and communication equipment, and the importance of printed circuit boards has been increasing. Of various printed circuit boards, those using a flexible base are advantageous for size and weight reductions and capable of surface mounting.

Flexible bases are generally produced by laminating a copper foil on a heat resistant film, such as a polyimide film, with an adhesive (adhesive lamination) or without an adhesive (two-ply lamination). Where a copper foil is laminated via an adhesive, the heat resistance of the base is largely dependent on the heat resistance of the adhesive, and the heat resistance inherent to the heat resistant film cannot be taken full advantage of. Accordingly, use of a two-ply base obtained by laminating a copper foil on a heat resistant film without using an adhesive has been extending.

On the other hand, a flexible printed circuit board is usually covered with a cover-lay film, such as a polyimide film, in order to protect a printed circuit from moisture or foreign matters. Adhesive lamination of the cover-lay film would also give rise to a problem of reduction in heat resistance. Since most polyimide films have no adhesion by themselves, it has been required to apply an adhesive on the film.

However, epoxy-based adhesives which are widely used in the art do not have sufficient heat resistance. Adhesion structures using a thermoplastic polyimide resin as an adhesive have recently been proposed. While excellent in heat resistance and storage stability, thermoplastic polyimide resins require relatively high temperatures for adhesion and are still unsatisfactory in workability.

Additionally, thermoplastic polyimide resins have a high coefficient of linear expansion. When used for adhesive lamination of a copper foil or a cover-lay film, they sometimes fail to obtain sufficient dimensional stability or cause curling due to the difference from an adherend in linear expansion coefficient.

It has thus been demanded to develop a cover-lay film, a laminate film (such as a two-ply base) or an adhesive film having excellent workability, dimensional stability, and heat resistance in which or with which adhesion is achieved with no adhesive.

SUMMARY OF THE INVENTION

One object of the present invention is to provide a heat-resistant adhesive film which provides an adhesion structure having excellent heat resistance and dimensional stability with satisfactory workability.

Another object of the present invention is to provide an adhesion structure having excellent heat resistance and dimensional precision, which is obtained by using the above-described adhesive film.

A further object of the present invention is to provide a method of adhesion using the above-described adhesive film.

As a result of extensive investigations, the present inventors have found that a film of a polyimide precursor having a specific content of an isoimide unit in the molecule thereof exhibits excellent heat resistance, workability, and thermal adhesion, in which the isoimide unit is converted to an imide unit on heating. The present invention has been completed based on this finding.

The present invention provides a heat-resistant adhesive film comprising a polyisoimide resin containing at least 40 mol % of an isoimide unit represented by formula (I) shown below in the molecule thereof.

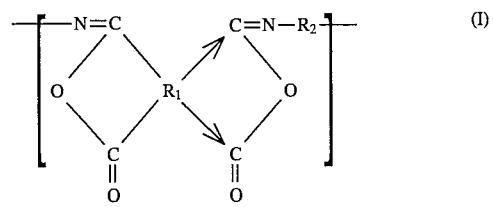

wherein $R_1$ represents a tetravalent aromatic or aliphatic residue; $R_2$ represents a divalent aromatic or aliphatic residue; and the arrow represents a bond replaceable on isomerization.

The adhesive film of the present invention embraces an embodiment in which the isoimide unit has been converted to an imide unit by heating and an embodiment in which the adhesive film is formed on one side of a support.

The present invention further provides an adhesion structure comprising the above-described heat-resistant adhesive film put on an adherend, in which the polyisoimide resin has been converted to a polyimide resin.

The present invention furthermore provides a method of adhesion comprising putting the above-described heat-resistant adhesive film on an adhererid and hot pressing the film at a temperature not lower than the glass transition temperature of the polyisoimide resin to convert the polyisoimide resin to a polyimide resin.

According to this adhesion method, the resulting polyimide resin film has a glass transition temperature higher than that of the starting polyisoimide resin by 20° C. or more to show improved heat resistance and, at the same time, a coefficient of linear expansion of not more than 50 ppm to show very satisfactory dimensional precision.

DETAILED DESCRIPTION OF THE INVENTION

The polyisoimide resin which can be used in the present invention contains at least 40 mol %, preferably 80 mol % or more, of an isoimide unit represented by formula (I). If the isoimide unit content is less than 40 mol %, that is, if the molecular has a high imide unit content, the temperature of hot pressing must be raised, and the workability is so reduced. Besides, such a resin film is apt to be less etchable in dry etching with a laser beam or wet etching with a chemical.

The polyisoimide resin of the present invention can be prepared by reacting monomers known for polyimide synthesis, i.e., an aliphatic tetracarboxylic acid dianhydride component and an aromatic or aliphatic diamine component, to once prepare a polyamic acid and then cyclizing the polyamic acid by using a dehydrating condensation agent, such as dicyclohexylcarbodiimide, trifluoroacetic acid anhydride, thionyl chloride, phosphorus trichloride, ethyl chloroformate or acetic anhydride. As far as the isoimide unit content falls within the above-described specific range, the polyisoimide may contain a polyamic acid unit or a polyimide unit. However, too high a polyamic acid unit content results in considerable dimensional shrinkage on dehydrating condensation into an imide unit. To avoid this, the polyamic acid unit content in the molecule should be not more than 10 mol %.

Suitable tetracarboxylic acid dianhydride components which can be used in the present invention include dianhydrides of tetracarboxylic acids, such as pyromellitic acid, 3,3',4,4'-biphenyltetracarboxylic acid, 2,2',3,3'-biphenyltetracarboxylic acid, 4,4'-hydroxydiphthalic acid, 2,2',3,3'-benzophenonetetracarboxylic acid, 3,3',4,4'-benzophenonetetracarboxylic acid, 2,2-bis(3,4-dicarboxyphenyl)propane, 2,2-bis(3,4-dicarboxyphenyl)sulfone, bis(3,4-dicarboxyphenyl)methane, bis(2,3-dicarboxyphenyl)methane, 2,2-bis(2,3-dicarboxyphenyl)hexafluoropropane, 2,2-bis(3,4-dicarboxyphenyl)hexafluoropropane, bis(3,4-dicarboxyphenyl)difluoromethane, bis(2,3-dicarboxyphenyl)difluoromethane, 2,3,6,7-naphthalenetetracarboxylic acid, 1,4,5,8-naphthalenetetracarboxylic acid, hydroxyquinone diether, and 1,3-bis(3,4-dicarboxyphenyl)-1,1,3,3-tetramethyldisiloxane; and derivatives thereof. These tetracarboxylic acid dianhydride components may be used either individually or in combination of two or more thereof. The above-illustrated tetracarboxylic acid dianhydride components may be structural isomers.

Suitable diamine components which can be used in the present invention include 2,2-bis(trifluoromethyl)-4,4'-diaminobiphenyl, p-phenylenediamine, m-phenylenediamine, 4,4'-diaminodiphenyl ether, 3,4'-diaminodiphenyl ether, 2,4'-diaminodiphenyl ether, 3,3'-diaminodiphenyl ether, 4,4'-diaminodiphenylsulfone, 3,4'-diaminodiphenylsulfone, 3,3'diaminodiphenylsulfone, 4,4'-diaminodiphenyl sulfide, 3,4'-diaminodiphenyl sulfide, 3,3'-diaminodiphenyl sulfide, 4,4'diaminobenzophenone, 4,4'-diaminodiphenylpropane, 3,4'-diaminodiphenylpropane, 3,3'-diaminodiphenylpropane, 4,4'-diaminodiphenylhexafluoropropane, 3,4'-diaminodiphenylhexafluoropropane, 3,3'-diaminodiphenylhexafluoropropane, bis[4-(3-aminophenoxy)phenyl]methane, bis[4-(4-aminophenoxy)phenyl]methane, 2,2-bis[4-(3-aminophenoxy)-phenyl]propane, 2,2-bis[4-(4-aminophenoxy)phenyl]propane, 2,2bis[4-(3-aminophenoxy)phenyl]hexafluoropropane, 2,2-bis[4-(4-aminophenoxy)phenyl]hexafluoropropane, 1,3-bis(3-aminophenoxy)benzene, 4,4'-bis(4-aminophenoxy)biphenyl, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl-]ether, 4,4'-diaminobenzanilide, 1,4-bis(4-aminophenoxy)benzene, 1,3-bis(4-aminophenoxy)benzene, and bis[4-(4-aminophenoxy)phenyl]ether. These diamine components may be used either individually or in combination of two or more thereof. The above-illustrated diamine components may be structural isomers.

The acid dianhydride component and the diamine component are used in an approximately equimolar ratio. The reaction is usually carried out by solution polymerization in an organic solvent to prepare a polyamic acid, which is then converted to polyisoimide under the above-described conditions. Suitable reaction solvents include N-methyl-2-pyrrolidone, N,N-dimethylacetamide, N,N-dimethylformamide, 1,3-dimethyl-2-imidazolidinone, dimethyl sulfoxide, dimethyl sulfide, dimethylsulfone, pyridine, tetramethylurea, diglyme, triglyme, tetrahydrofuran, dioxane, dichloroethane, dichloromethane, acetonitrile, methyl ethyl ketone, methyl isobutyl ketone, toluene, and xylene.

The resulting polyisoimide-containing resin solution is applied on one side of a flexible substrate by cast coating with a roller coater, a reverse coater, a knife coater, a doctor blade, etc. to a dry thickness of from about 2 to 200 μm and dried at a temperature of from 50° to 200° C. to remove the organic solvent. Care should be taken in setting the drying temperature because too high temperatures (e.g., 300° C. or higher) cause polyisoimide to be converted to polyimide. Heating is preferably conducted in an oxygen-free atmosphere, usually in an inert gas atmosphere or under reduced pressure. The resin film may have a single layer structure or a multi-layer structure. In the latter case, the polyisoimide composition may be varied in the thickness direction.

The above-described polyisoimide resin solution may be applied as such on a copper-clad laminate to form a cover-lay film or may be coated on a support to provide a heat-resistant adhesive film having a thermally adhesive resin layer. The support used includes plastic films and metal foils. When applied on a plastic film, the resulting adhesive film is useful as a cover-lay film for protection of a circuit pattern formed on a flexible base or a rigid base. Any plastic film having insulating properties, such as a polyester film or a polyimide film, may be employed as a support. A polyimide film is preferred from the standpoint of heat resistance.

When applied on a metal foil support, such as a copper foil, an aluminum foil, a nickel foil or a stainless steel foil, there is provided a flexible two-ply base having thermal adhesive properties. Two two-ply bases may be bonded together with the respective adhesive film side inside to prepare a double-sided base. A plurality of two-ply bases may be laminated to prepare a multi-ply base. The metal foil of the two-ply or multi-ply bases is patterned to provide a circuit board. Further, through-holes can be formed in these bases by subjecting to dry etching with a laser, such as an excimer laser, a carbonic acid gas laser, a YAG laser, an argon ion layer or a semiconductor laser, or wet etching which comprises forming a commercially available negatively or positively working photoresist on the resin layer, exposing the photoresist to light, such as UV light, if necessary through a photomask, and removing the unexposed area with an etching solution. Since the polyisoimide is soluble in an organic solvent, an aqueous solution of an inorganic alkali, such as sodium hydroxide or potassium hydroxide, or a mixed solution of an alcohol and an aqueous solution of an organic alkali, such as tetramethylammonium hydroxide, removal of the unexposed resin layer is suitably effected with these etching solutions.

The isoimide unit in the thus obtained heat-resistant adhesive film is easily converted to an imide unit on heating (hereinafter referred to as "isoimide to imide conversion"). The adhesive film of the present invention exhibits markedly excellent dimensional stability since the isoimide to imide conversion is not accompanied by shrinkage, as is observed in polyamic acid to imide conversion.

Where an adhesive film laminated on a plastic film support is used as a cover-lay film, it is superposed on a printed circuit formed on a flexible base and hot pressed at 100° to 400° C., preferably from 250° to 350° C., under a pressure of from 1 to 250 kg/cm$^2$, preferably from 5 to 100 kg/cm$^2$, by means of a hot press and the like. If the heating temperature or the pressure is too low, sufficient adhesive strength cannot be obtained. If the temperature is too high, the film may reach the brittle temperature or the decomposition temperature. If the pressure is too high, the copper circuit pattern tends to separate from the base film. To secure thermal adhesion, hot pressing is preferably conducted for 1 second or longer.

In carrying out the adhesion method of the present invention, the heating for hot pressing should be above the glass transition temperature of the polyisoimide resin so as to ensure isoimide to imide conversion and to obtain satisfactory workability and, in addition, to provide a polyimide resin film whose glass transition temperature may become at least 20° C. higher than that of the polyisoimide resin. It follows that the resulting adhesive film exhibits satisfactory heat resistance and has a coefficient of linear expansion of not more than 50 ppm thereby providing an adhesive structure with extremely excellent dimensional precision.

If desired, a catalyst for accelerating isoimide to imide conversion may be used aiming at complete conversion. Such a catalyst includes organic bases, such as pyridine and triethylamine, and organic acids, such as trifluoroacetic acid and p-toluenesulfonic acid.

The present invention will now be illustrated in greater detail with reference to Examples, but it should be understood that the present invention is not construed as being limited thereto.

EXAMPLE 1

In 258 g of N,N'-dimethylacetamide was dissolved 20.0 g (0.1 mol) of 4,4'-diaminodiphenyl ether, and 44.4 g (0.1 mol) of 2,2-bis(3,4-dicarboxyphenyl)hexafluoropropane dianhydride was slowly added thereto to conduct polymerization at room temperature for 12 hours to obtain a polyamic acid solution.

To the resulting solution was added 41.2 g (0.2 mol) of dicyclohexylcarbodiimide, and the mixture was allowed to react at room temperature for 4 hours. The precipitated urea derivative was removed by filtration under pressure to recover a polyisoimide solution. The solid matter of the polyisoimide solution had an isoimide unit content of 95 mol %.

The polyisoimide solution was uniformly cast coated on a 25 μm thick polyimide film with a reverse coater to a dry thickness of 25 μm and continuously heated at 100° C. to remove the solvent. Subsequently, the film was heated at 200° C. in a continuous heating oven having been purged with nitrogen to reduce the oxygen concentration to 1.5% or less.

The thus obtained heat resistant adhesive film was superposed on a printed circuit board having a line and space width of 300 μm as a cover-lay film and hot pressed at 360° C. by means of a hot press to convert the polyisoimide to imide. The hot pressing conditions and the results obtained are shown in Table 1 below.

EXAMPLE 2

A heat-resistant adhesive film (single-sided base) was obtained in the same manner as in Example 1, except for replacing the polyimide film support to a 35 μm thick copper foil.

Two adhesive films thus obtained were hot pressed together at 350° C. with the respective polyisoimide layer inside to obtain a double-sided base. The hot pressing conditions and the results obtained are shown in Table 1.

EXAMPLE 3

A polyamic acid solution and a polyisoimide solution were prepared in the same manner as in Example 1, except for using 0.1 mol of bis[4-(4-aminophenoxy)phenyl]propane and 0.1 mol of 4,4'-hydroxydiphthalic acid dianhydride as monomers. The isoimide unit content in the solid matter of the polyisoimide solution was 96 mol %.

A heat-resistant adhesive film was prepared in the same manner as in Example 2, except for using the above-prepared polyisoimide solution.

Two adhesive films thus obtained were hot pressed at 300° C. with the respective polyisoimide layer inside to obtain a double-sided base. The hot pressing conditions and the results obtained are shown in Table 1.

COMPARATIVE EXAMPLE 1

The same polyamic acid solution as obtained in Example 1 was cast coated on a 25 μm thick polyimide film in the same manner as in Example 1, and the solvent was removed by continuously heating at 100° C. The film was further heated at 400° C. in a continuous heating oven having been purged with nitrogen to reduce the oxygen concentration to 1.5% or less to convert the polyamic acid to imide.

The resulting polyimide/polyimide laminate film was superposed on a printed circuit board having a line and space width of 300 μm as a cover-lay film and hot pressed at 380° C. by means of a hot press. The hot pressing conditions and the results obtained are shown in Table 1 below.

COMPARATIVE EXAMPLE 2

A single-sided base comprising a copper foil and a polyimide layer was prepared in the same manner as in Example 3, except for using the polyamic acid solution obtained in Example 3. A double-sided base was prepared using a pair of the resulting single-sided bases in the same manner as in Example 3. The hot pressing conditions and the results obtained are shown in Table 1.

TABLE 1

| Example No. | Hot Pressing Conditions | | | | Tg | |
|---|---|---|---|---|---|---|
| | Temp. (°C.) | Pressure (kg/cm$^2$) | Time (min) | Adhesion | Before Hot pressing (°C.) | After Hot pressing (°C.) |
| Example 1 | 360 | 80 | 15 | satisfactory | 235 | 281 |
| Example 2 | 350 | 100 | 20 | satisfactory | 235 | 281 |
| Example 3 | 300 | 60 | 15 | satisfactory | 175 | 225 |
| Comparative Example 1 | 380 | 200 | 30 | no adhesion | — | 225 |
| Comparative Example 2 | 330 | 100 | 30 | partly peeled | — | 225 |

EXAMPLE 4

The same polyisoimide solution as obtained in Example 1 was uniformly cast coated on a 35 μm thick copper foil with a reverse coater to a dry thickness of 25 μm and continuously heated at 100° C. to remove the solvent. The film was further heated at 200° C. in a continuous heating oven having been purged with nitrogen to reduce the oxygen concentration to 1.5% or less to obtain a heat-resistant adhesive film comprising a copper foil and a polyisoimide layer.

The adhesive film was irradiated with a laser beam of an excimer laser (oscillation wavelength: 248 nm; energy: 1 J/cm; recurring frequency: 150 Hz) through a mask at a machining speed of 40 μm/sec to make through-holes having a diameter of 60 μm.

The adhesive film was heated at 400° C. in a continuous heating oven having been purged with nitrogen to an oxygen concentration of 1.5% or less for isoimide to imide conversion to prepare a two-ply flexible base.

EXAMPLE 5

The same polyisoimide solution as obtained in Example 1 was cast coated on the copper side (already patterned) of a two-ply base composed of a 18 μm thick copper foil and a 25 μm thick polyimide film by means of a reverse coater to a dry thickness of 10 μm and continuously heated at 100° C. to remove the solvent. The coated film was further heated at 200° C. in a continuous heating oven having an oxygen concentration of 1.5% or less to prepare a two-ply base having a polyisoimide cover-lay film thereon.

A negatively working rubber-based resist was applied on the cover-lay film, dried, exposed to light through a mask, and developed to form a resist pattern. The unexposed area of the cover-lay film was etched with a mixed etching solution of potassium hydroxide and isopropyl alcohol to form through-holes.

Finally, the laminate was heated at 400° C. in a continuous heating oven having an oxygen concentration of 1.5% or less for isoimide to imide conversion to obtain a flexible printed circuit board.

EXAMPLE 6

A flexible printed circuit board was prepared in the same manner as in Example 5, except for using the polyisoimide solution obtained in Example 3.

COMPARATIVE EXAMPLE 3

A copper foil/polyamic acid film was prepared in the same manner as in Example 4, except for using the polyamic acid solution obtained in Example 1. The laminate film was heated at 400° C. in a continuous heating oven to convert the polyamic acid to imide to prepare a copper foil/polyimide film two-ply base.

The two-ply base was subjected to laser machining in the same manner as in Example 4. The machining speed was 24 μm/sec, requiring much time for laser machining.

COMPARATIVE EXAMPLE 4

The polyamic acid solution obtained in Example 3 was cast on a glass plate, dried at 150° C. for 1 hour, and then heated at 400° C. in a heating oven having been purged with nitrogen to reduce the oxygen concentration to 1.5% or less to obtain a polyimide film having a thickness of 25 μm.

The resulting polyimide cast film was hot pressed onto a copper circuit pattern of a two-ply base composed of a 18 μm thick copper foil and a 25 μm thick polyimide film at 360° C. and 80 kg/cm$^2$ to obtain a polyimide cover-lay film.

The resulting two-ply base with a cover-lay film was subjected to etching in the same manner as in Example 5, but the cover-lay film underwent deterioration during etching, failing to obtain a flexible printed circuit board.

EXAMPLE 7

In 1149 g of N-methyl-pyrrolidone was dissolved 64 g (0.2 mol) of 2,2-bis(trifluoromethyl)-4,4-diaminobiphenyl, and 58.8 g (0.2 mol) of 3,3',4,4'-biphenyltetracarboxylic acid dianhydride was added thereto at room temperature. The mixture was allowed to react for 12 hours to obtain a polyamic acid solution (A).

To polyamic acid solution (A) were added 56 ml (0.4 mol) of trifluoroacetic acid anhydride and 56 ml (0.4 mol) of triethylamine, and the mixture was allowed to react at room temperature for 4 hours. After completion of the reaction, the reaction mixture was poured into excess isopropyl alcohol. The precipitated polyisoimide was collected by filtration, washed with isopropyl alcohol, and dried at 40° C. under reduced pressure to obtain polyisoimide powder. The powder had a glass transition temperature of 280° C. as measured with a differential scanning calorimeter (DSC). The polyisoimide powder was dissolved in N,N-dimethylacetamide to prepare a polyisoimide solution (A) having a polymer content of 20% by weight.

Polyisoimide solution (A) was uniformly cast coated on a 35 μm thick copper foil with a reverse coater to a dry thickness of 25 μm and continuously heated at 100° C. to remove the solvent. The laminate film was further heated at 200° C. in a continuous heating oven having been purged with nitrogen to reduce the oxygen concentration to 1.5%. The laminate film was cut to an appropriate size and dried at 200° C. for 4 hours under reduced pressure to obtain a heat-resistant adhesive film composed of a polyisoimide layer and a copper foil.

Two adhesive films thus obtained were hot pressed together with the polyisoimide layers inside at 370° C. and 80 kg/cm$^2$ for 15 minutes to obtain a double-sided base. The copper foil of the double-sided base was removed by etching to expose the resin layer. The infrared absorption spectrum of the exposed resin layer lent confirmation to complete isoimide to imide conversion. The linear expansion coefficient of the polyimide layer was found to be 30 ppm. The adhesion state and the glass transition temperature change are shown in Table 2 below.

EXAMPLE 8

A heat-resistant adhesive film was prepared in the same manner as in Example 7, except for replacing the copper foil with a 25 μm thick polyimide film.

The resulting laminate film was superposed on a printed circuit board having a line and space width of 300 μm as a cover-lay film and hot pressed at 370° C. and 100 kg/cm$^2$ for 20 minutes by means of a hot press to obtain a printed circuit board having a cover-lay film thereon. It was found that the polyisoimide had been completely converted to imide. The cover-lay film had a linear expansion coefficient of 30 ppm. The adhesion state and the glass transition temperature change are shown in Table 2.

EXAMPLE 9

A polyamic acid solution (B) was prepared in the same manner as in Example 7, except for using 11.5 g (0.06 mol) of pyromellitic acid dianhydride and 43.4 g (0.14 mol) of 4,4'-hydroxydiphthalic acid dianhydride as acid anhydride components and 1070 g of N-methyl-pyrrolidone as a reaction solvent.

The resulting polyamic acid solution was treated in the same manner as in Example 7 to obtain polyisoimide powder having a glass transition temperature of 240° C. as measured with a DSC. The powder was dissolved in N,N-dimethylacetamide to prepare a polyisoimide solution (B) having a polymer content of 20% by weight.

A heat-resistant adhesive film was prepared in the same manner as in Example 7, except for using solution (B), and a double-sided base was prepared using the resulting adhesive films under hot pressing conditions of 380° C., 100 kg/cm$^2$, and 15 minutes. The polyisoimide layer was found to have been completely converted to imide. The linear expansion coefficient was 16 ppm. The adhesion state and the glass transition temperature change are shown in Table 2.

COMPARATIVE EXAMPLE 5

Polyamic acid solution (A) prepared in Example 7 was cast coated on a 35 μm thick copper foil in the same manner as in Example 7, continuously heated at 100° C. to remove the solvent, and further heated at 400° C. in a continuous heating oven having been purged with nitrogen to reduce the oxygen concentration to 1.5%. The resulting laminate film was cut to an appropriate size to obtain a heat resistant film composed of a polyimide resin layer and a copper foil.

Two laminate films thus prepared were hot pressed together with the polyimide layers inside at 390° C. and 120 kg/cm$^2$ for 20 minutes, but the polyimide layers showed no adhesion, failing to prepare a double-sided base. The polyimide layer had a linear expansion coefficient of 30 ppm. The adhesion state and the glass transition temperature change are shown in Table 2.

COMPARATIVE EXAMPLE 6

Polyamic acid solution (B) prepared in Example 9 was cast coated on a 25 μm thick polyimide film and heat-treated for polyamic acid to polyimide conversion in the same manner as in Comparative Example 1 to prepare a heat resistant polyimide/polyimide laminate film.

The resulting laminate film was superposed on a printed circuit board having a line and space width of 300 μm as a cover-lay film and hot pressed at 390° C. and 150 kg/cm$^2$ for 30 minutes by means of a hot press. The laminate film was not completely adhered and partly peeled. The linear expansion coefficient was 16 ppm. The adhesion state and the glass transition temperature change are shown in Table 2.

TABLE 2

|  | Example 7 | Example 8 | Example 9 | Compar. Example 5 | Compar. Example 6 |
|---|---|---|---|---|---|
| Adhesion | satisfactory | satisfactory | satisfactory | no adhesion | partly peeled |
| Tg (°C.): |  |  |  |  |  |
| Before hot pressing | 270 | 270 | 290 | — | — |
| After hot pressing | 320 | 320 | 350 | 320 | 350 |
| Coefficient of Linear Expansion (ppm) | 30 | 30 | 16 | 30 | 16 |

Comprising a resin layer containing a specific isoimide unit having thermal adhesion properties, the heat-resistant adhesive film according to the present invention is excellent in heat resistant adhesion and provides, on heating, an adhesion structure having a small coefficient of linear expansion and satisfactory dimensional precision. By virtue of the isoimide unit in the resin layer, the adhesive film exhibits satisfactory thermal adhesiveness to a polyimide structure having no thermoplasticity. According to the adhesion method of the present invention, the isoimide unit in the resin layer easily undergoes intermolecular imide conversion on heating to prepare polyimide having an increased glass transition temperature. Therefore, the adhesion method is advantageous in production of cover-lay films, two-ply bases, and multi-ply bases excellent in heat resistance and chemical resistance.

The resin layer constituting the present invention exhibits satisfactory processability and productivity in laser machining or wet etching.

While the invention has been described in detail and with reference to specific examples thereof, it will be apparent to one skilled in the art that various changes and modifications can be made therein without departing from the spirit and scope thereof.

What is claimed is:

1. A heat-resistant adhesive film comprising a polyisoimide resin containing at least 40 mol % of an isoimide unit represented by formula (I):

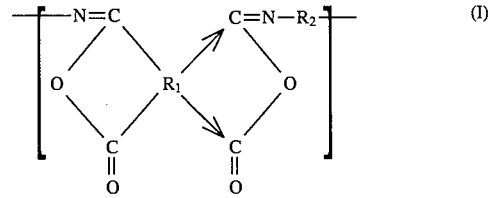

wherein R$_1$ represents a tetravalent aromatic or aliphatic residue; R$_2$ represents a divalent aromatic or aliphatic residue; and the arrows represents a bond replaceable on isomerization, in the molecule thereof.

2. A heat-resistant adhesive film comprising a polyimide resin obtained by heating a heat-resistant adhesive film comprising a polyisoimide resin containing, in the molecule thereof, at least 40 mol % of an isoimide unit represented by formula (I):

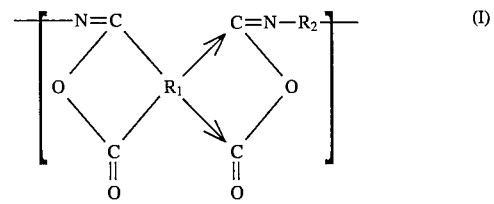

wherein R$_1$ represents a tetravalent aromatic or aliphatic residue; R$_2$ represents a divalent aromatic or aliphatic residue; and the arrows represents a bond replaceable on isomerization, to convert said isoimide unit to an imide unit.

3. A heat-resistant adhesive film comprising a support having formed thereon a heat-resistant adhesive film comprising a polyisoimide resin containing at least 40 mol % of an isoimide unit represented by formula (I):

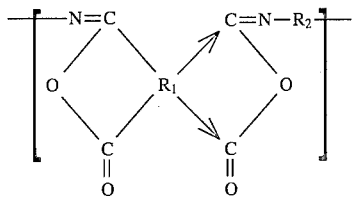

wherein $R_1$ represents a tetravalent aromatic or aliphatic residue; $R_2$ represents a divalent aromatic or aliphatic residue; and the arrows represents a bond replaceable on isomerization, in the molecule thereof.

4. A heat-resistant adhesive film as claimed in claim 3, wherein said support is a flexible support.

5. A heat-resistant adhesive film as claimed in claim 3, wherein said support is a plastic film or a metal foil.

* * * * *